United States Patent
Berry

(10) Patent No.: US 6,747,513 B1
(45) Date of Patent: Jun. 8, 2004

(54) HIGH FIDELITY FLOATING BRIDGE AMPLIFIER

(76) Inventor: Joseph Norman Berry, 918 Jami Ct., Lawrenceville, GA (US) 30045

( * ) Notice: Subject to any disclaimer, the term of this patent is extended or adjusted under 35 U.S.C. 154(b) by 0 days.

(21) Appl. No.: 10/195,608

(22) Filed: Jul. 15, 2002

Related U.S. Application Data

(60) Provisional application No. 60/305,803, filed on Jul. 16, 2001.

(51) Int. Cl.[7] .............................................. H03F 3/217
(52) U.S. Cl. ...................... 330/251; 330/146; 330/51; 330/207 A
(58) Field of Search ...................... 330/51, 146, 207 A, 330/251; 381/94.5

(56) References Cited

U.S. PATENT DOCUMENTS

| | | | |
|---|---|---|---|
| 2,705,265 A | 3/1955 | Hall | |
| 2,828,369 A | 3/1958 | Wiggins | |
| 3,351,866 A | 11/1967 | Goldsmith | 330/273 |
| 4,107,619 A | 8/1978 | Pass | 330/255 |
| 4,229,706 A | 10/1980 | Bongiorno | 330/272 |
| 4,719,431 A | 1/1988 | Karsten | 330/273 |
| 4,910,477 A * | 3/1990 | Gross | 330/263 |
| 6,072,362 A * | 6/2000 | Lincoln | 330/10 |
| 6,204,729 B1 * | 3/2001 | Takita | 330/146 |
| 6,242,977 B1 | 6/2001 | Karsten | 330/146 |
| 6,486,643 B2 * | 11/2002 | Liu | 323/268 |

OTHER PUBLICATIONS

Kimmel, Alan, "Sweep Tube OTL Monoblock Amplifier," Vacuum Tube Valley magazine, Sunnyvale CA USA, Issue 8 (Fall/Winter 1997), pp. 10–14.

Karsten, Ralph, Atma–Sphere M–60 MkII Amplifier schematic diagram, 1999, Atma–Sphere Music Systems, St. Paul, MN USA, 1 page.

Bongiorno, James, Sumo Model Nine Amplifier schematic diagram, 1981, Sumo Electric Co., Chatsworth, CA USA, 1 page.

* cited by examiner

*Primary Examiner*—Tuan T. Lam
*Assistant Examiner*—Hiep Nguyen

(57) ABSTRACT

A high fidelity audio amplifier is provided having a solid-state floating bridge output stage and a preceding solid-state driver stage configured to operate with negligible voltage fluctuations and minimal current fluctuations, resulting in reduced driver stage distortion, freedom from driver stage clipping, and high and linear impedance at the driver input terminals, without significant increase in circuit complexity. The voltage gain and current gain sections of the amplifier form self-contained units which may be separately housed and remotely operated to enhance utility and isolate sensitive voltage gain circuits from the radiated electrical noise and heat of the output stage.

19 Claims, 2 Drawing Sheets

HIGH FIDELITY FLOATING BRIDGE AMPLIFIER

CROSS-REFERENCE TO RELATED APPLICATIONS

This application is entitled to the benefit of Provisional Application Ser. No. 60/305,803 filed Jul. 16, 2001.

FEDERALLY SPONSORED RESEARCH

Not Applicable

SEQUENCE LISTING OR PROGRAM

Not Applicable

BACKGROUND

This invention relates to the field of amplifiers, and more particularly, to a high-fidelity audio amplifier having an improved floating bridge circuit topology.

It is well known among skilled high-fidelity audio amplifier designers that traditional performance measurements such as frequency response, total harmonic distortion, and output damping factor do not fully predict amplifier sound quality, particularly where high measured performance is achieved through the use of large amounts of global negative feedback. Some designers seeking to advance the art have therefore shifted their attention toward the intrinsic behavior of the amplifier prior to the application of feedback, believing that such "open loop" behavior better represents the performance of the amplifier once it is removed from the test bench, placed in a sound system, and judged by a listener. This has led to increased interest in amplifier topologies with the potential for high performance using little or no global negative feedback.

One such topology is the floating bridge or "circlotron," a unity gain current amplifier having a pair of gain devices and a pair of floating DC power supplies arranged in a balanced-bridge configuration. This current amplifier is typically combined with a preceding voltage amplifier to form a complete line-level or power amplification system. Audio amplifiers of this general type are well known in the prior art, the earliest examples being vacuum tube power amplifier circuits. U.S. Pat. No. 2,705,265 (1955) to Hall and U.S. Pat. No. 2,828,369 (1958) to Wiggins describe examples of such designs. More recently, solid state amplifiers using a floating bridge output stage have appeared. U.S. Pat. No. 4,229,706 (1980) to Bongiomo and U.S. Pat. No. 4,719,431 (1988) to Karsten describe floating bridge amplifiers using bipolar junction transistor (BJT) output stages, while U.S. Pat. No. 6,242,977 (2001) to Karsten describes a floating bridge amplifier using metal oxide semiconductor field effect transistor (MOSFET) gain devices.

The replacement of vacuum tubes with solid-state devices significantly improves the open-loop performance of a floating bridge output stage. The higher transconductance of solid-state devices results in more accurate tracking of the input signal voltage, while their superior aging characteristics allow for more reliable selection of matched gain devices for enhanced symmetry and more complete cancellation of evenorder distortion products. The solid-state floating bridge thus offers a firm foundation for linear open-loop design, particularly when the output stage operates in class A up to at least one-tenth of its maximum output power (the range where most listening occurs), or where practical, over its entire output power envelope.

In such an implementation, the major remaining performance limitation in a solid-state floating bridge amplifier is the nonlinear transfer of signal voltage from the preceding voltage amplifier output to the current amplifier input. In a BJT output stage, this nonlinearity results mainly from dynamic fluctuations in the current gain (beta) of the output devices, while in a power MOSFET output stage, it results mainly from dynamic fluctuations in the input capacitance of the output MOSFETs. Either condition is reflected as a nonlinear input impedance to the output stage that tends to distort the applied input signal.

An obvious solution to this problem which does not involve global negative feedback is to add a unity-gain emitter or source follower driver stage ahead of the floating bridge output stage. This reduces overall nonlinearity by essentially substituting the smaller nonlinearities of the driver gain devices for the larger nonlinearities of the output gain devices. However, the effectiveness of this approach has been limited in the past because the driver stage works under conditions not optimized for linear operation, and thus contributes significant distortion of its own. All driver circuits available under the prior art for use in a solid-state floating bridge share this limitation to some degree, and may introduce additional performance limitations.

Depending on configuration, these prior art driver circuits suffer from one or more of the following drawbacks:

a) Distortion contributed by the driver stage itself. In U.S. Pat. No. 4,107,619 (1978), Pass teaches that distortion in any amplifying device arises when the gain of the device is altered by changing voltage across the device and changing current through the device; and conversely, that distortion may be improved by reducing or eliminating such voltage and current changes. All prior art floating bridge driver topologies go against this teaching by operating the driver gain devices in such a way that they experience either large voltage swings or large current variations, or both. While U.S. Pat. No. 4,107,619 prescribes remedies such as cascoding and current bootstrapping for improving prior art circuits in this regard, these techniques can significantly reduce operating efficiency and increase circuit complexity, especially when used in a power amplifier.

b) Reduced output and operating efficiency. Even without cascading and current bootstrapping, inserting a driver stage in the signal path can reduce the maximum output voltage swing of the amplifier system by the amount of voltage needed to keep the driver gain devices in conduction. This can result in a loss of several volts of output swing, sufficient to reduce a 50 watt amplifier to 35 watts output, with a corresponding loss in operating efficiency.

c) Nonlinear loading of the preceding voltage amplifier output. Nonlinear behavior in a BJT or MOSFET driver gain device results in nonlinear impedance at the device input terminal, just as it does with the output gain devices. The addition of a driver generally reduces the magnitude of the problem, but does not eliminate it. This requires that the preceding voltage amplifier enforce linear operation by maintaining a much lower output impedance than otherwise would be needed, either intrinsically by operating at relatively high idle current, or through the use of negative feedback, which in practice requires that the voltage amplifier be located physically close to the current amplifier, where its radiated noise and heat could reduce the performance, and possibly the longevity, of the voltage amplifier.

Thus, it can be seen that adding a driver stage to a solid-state floating bridge amplifier under the prior art, while highly desirable, involves various compromises and trade-offs, potentially resulting in only limited performance improvement at the cost of increased complexity, reduced operating efficiency, and the need for close integration of amplifier circuits that might benefit from physical separation. The present invention overcomes these limitations and provides additional benefits.

Several objects and advantages of the present invention are:

a) To provide a floating bridge amplifier of improved open-loop performance but without significant increase in design complexity and without significant reduction in overall operating efficiency.

b) To provide an efficient, low-distortion floating bridge amplifier having almost rail-to-rail output voltage swing.

c) To provide a floating bridge amplifier having a high and linear driver stage input impedance, ensuring compatibility with a wide range of associated voltage amplifier circuits, and facilitating the physical separation of the voltage and current amplifiers where beneficial to the application.

Further objects and advantages of this invention will become apparent from the following descriptions of the preferred embodiments.

SUMMARY

An audio amplifier of the present invention includes a solid-state floating bridge output stage and a preceding solid-state driver stage, both stages drawing their operating power from the same pair of floating DC power supplies, but through separate and independent signal-current paths whereby each driver gain device operates with minimal inter-electrode voltage swings and current variations. The output and driver stages, together with their common floating power supplies and bias source(s), form a current amplifier having low open-loop distortion, almost rail-to-rail output voltage swing, and high and linear input impedance. This current amplifier may be combined with a lowpower, high quality voltage amplifier, which may be separately enclosed to allow for remote operation or isolation from the radiated heat and electrical noise of the associated current amplifier. This improved topology enhances amplifier performance and utility without undue added design complexity or reduced operating efficiency.

DRAWINGS

DETAILED DESCRIPTION

Figure 1:
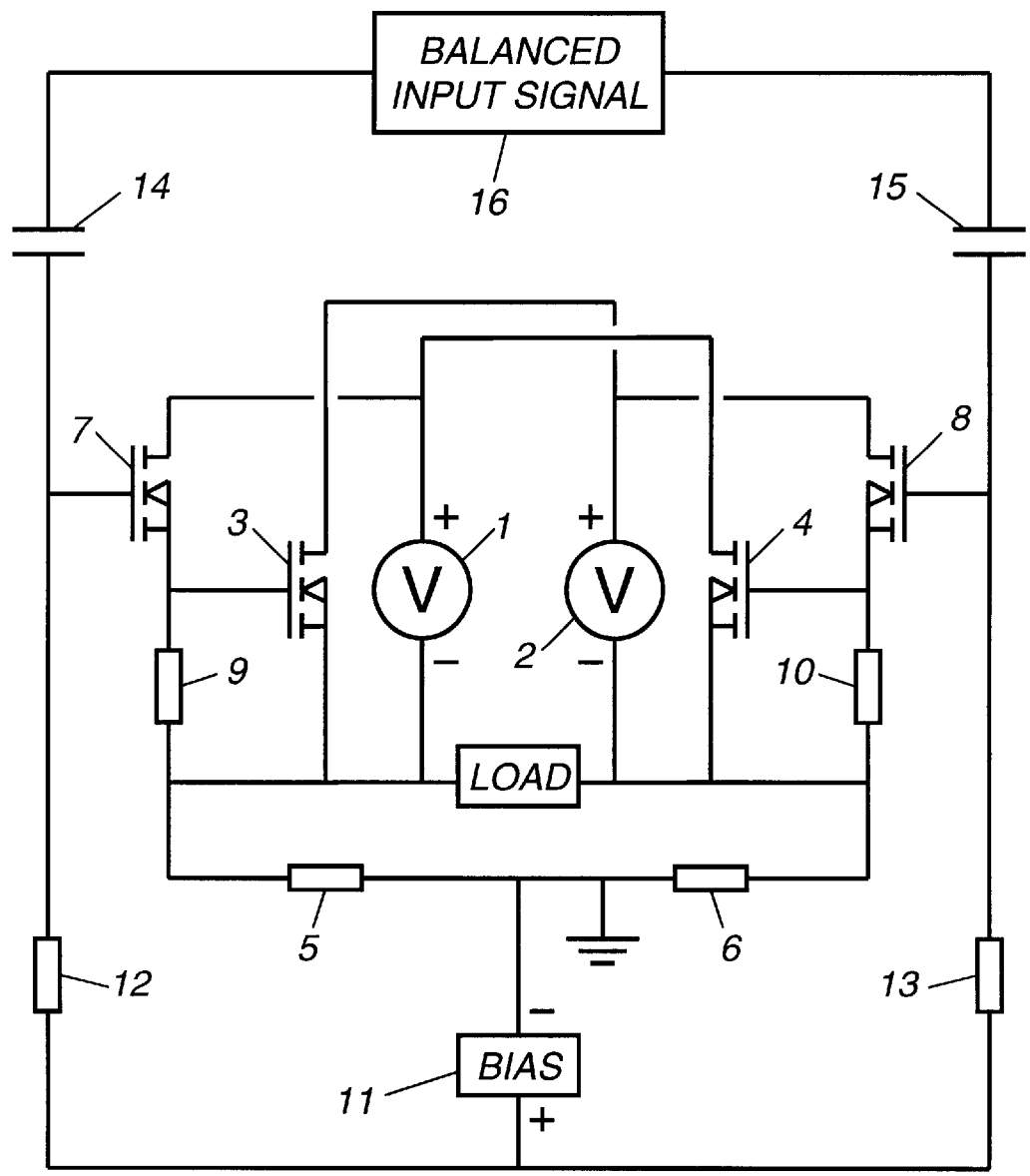
FIG. 1 is a general schematic of a currently preferred embodiment of the amplifier of the invention.

The general schematic of FIG. 1 is a preferred embodiment which also shows the basic concept of the invention. The circuit as shown comprises DC power supplies 1 and 2, N-channel enhancement-mode output power MOSFETs 3 and 4, ground reference resistors 5 and 6, N-channel enhancement-mode driver MOSFETs 7 and 8, driver source resistors 9 and 10, DC bias voltage source 11, bias decoupling resistors 12 and 13, signal coupling capacitors 14 and 15, and voltage amplifier 16.

DC power supplies 1 and 2 are typically derived from twin AC secondary windings of a power transformer, rectified by full-wave bridge rectifiers, and capacitively filtered. MOSFETs 3 and 4 may be multiple devices arranged in parallel to enhance transconductance and power handling, while driver MOSFETs 7 and 8 are typically single devices. DC bias voltage source 11 is typically derived from one or more DC power sources aboard the amplifier, is typically adjustable, and may be of the $V_{be}$ or $V_{gs}$ multiplier type to provide some temperature compensation for the bias. DC bias voltage source 11 may also include a means to adjust DC offset voltage across the output terminals, although such adjustment generally is not needed if output MOSFET pair 3, 4 and driver MOSFET pair 7, 8 are selected for matched Vgs at their respective idle currents, if not also for matched dynamic characteristics.

Resistors 5 and 6 provide a ground reference for the driver and output MOSFETs at each amplifier output terminal. If sufficiently low in value, these resistors may also serve to passively attenuate induced noise at the output terminals. These resistors are ideally equal in value and least two orders of magnitude higher than the nominal load impedance to avoid undue loss of operating efficiency. Bias decoupling resistors 12 and 13 are ideally equal in value and at least two orders of magnitude higher than the effective voltage amplifier output impedance at the lowest audio frequency of interest.

In a typical embodiment, voltage amplifier 16 is a simple differential voltage gain stage implemented with small-signal MOSFETs, FETs, miniature triode vacuum tubes, or other low-power gain devices. The exact makeup of voltage amplifier 16 is not critical, the only fixed requirements being that it furnish the voltage gain required for the application (usually 20–30 dB for a power amplifier, 20 dB or less for a line amplifier) and provide a differential analog output signal, i.e. a pair of identical but oppositely phased analog output signals, to drive the current gain section of the amplifier. In this embodiment, voltage amplifier 16 is assumed to be an integral part of the amplifier system. In other useful embodiments, it may be housed in a separate enclosure, or even omitted if the preceding component in the playback chain provides a differential analog output signal at the required voltage level.

Under no-signal conditions, the circuit forms a balanced bridge with the voltage across the audio load (typically a loudspeaker or terminated line) at zero volts and no current flowing in the load. The output and driver MOSFETs conduct a circulating DC idle current as set by bias voltage source 11 to place all MOSFETs in substantially linear portions of their respective operating curves. The idle current through driver MOSFET 7 flows through source resistor 9 to produce a bias voltage for output MOSFET 3, while the idle current through driver MOSFET 8 flows through source resistor 10 to produce the bias for output MOSFET 4.

A differential signal voltage supplied by voltage amplifier 16 is applied via signal coupling capacitors 14 and 15 to the gates of driver MOSFETs 7 and 8 at input terminals A and B, respectively. As the input signal varies, the driver MOSFETs buffer the signal voltage and communicate it via their source terminals to the gates of the output MOSFETs, supplying the current needed to charge the output MOSFET gate capacitance while accurately tracking the signal voltage. The output MOSFETs in turn communicate the signal voltages at their gates to the load at output terminals C and D, supplying the current needed to accurately maintain the signal voltage against variations in load impedance. Changes in output current are achieved by varying the drive currents through MOSFETs 7 and 8, which causes the voltage drops across source resistors 9 and 10 to vary, and with them, the signal currents through output MOSFETs 3 and 4. The relative magnitudes of the driver signal currents are minimized by choosing values for source resistors 9 and 10 that cause the driver MOSFETs to idle at DC currents much larger than the signal currents needed to drive the output stage.

As shown in FIG. 1, the drains of output MOSFETs 3 and 4 are cross-coupled to power supplies 2 and 1 respectively, so that the signal current drawn by MOSFET 3 is returned to power supply 2 through the load, and similarly for MOSFET 4 and power supply 1. By contrast, the drains of driver MOSFETs 7 and 8 are not cross-coupled, so the signal current drawn by MOSFET 7 circulates through power supply 1 and source resistor 9, entirely bypassing the load, and likewise for MOSFET 8, power supply 2, and source resistor 10. A desirable consequence of this driver connection is that the voltages across the drain-to-source conduction channels of the driver gain devices, as well as their gate-to-drain and gate-to-source voltages, are held nearly constant. This simultaneously improves the linearity of the driver gain devices under all operating conditions, prevents clipping in the driver stage at peak output voltage swing, and substantially corrects the nonlinear input impedance otherwise seen at the driver input terminals.

A surprising feature of this connection is that the signal current in the driver stage does not flow through the load despite having connections to the load through source resistors 9 and 10. This anomaly does not, however, impair the ability of the driver stage to buffer the signal and drive the output stage. Nor does the cycling of the driver stage signal currents through the power supplies cause significant loss of operating efficiency, as the total current available to drive the load is typically reduced by less than one percent relative to a prior art connection in which the drivers contribute to the total output current in the load.

The circuit of FIG. 1 may be modified to include additional components as dictated by the needs of the application and the electrical characteristics of the components chosen for the amplifier. For example, the output MOSFETs may be provided with source resistors (typically 0.1 to 1 ohm) to stabilize their DC operating points, provide local negative feedback, and ensure equal current sharing if the output stage includes multiple devices arranged in parallel. Zener diode voltage clamps, fuses, and thermally activated switches may be added to help protect the amplifier, the load, and the user from damage under fault conditions. The output stage and driver MOSFETs may be fitted with series gate resistors (typically 100 to 1000 ohms) to prevent self-oscillation in these components. In addition, high frequency damping capacitors (typically in the range of 10 to 100 pF) may be added across input terminals A and B, from each input terminal to ground, or elsewhere in the circuit to similar effect, to limit the amplifier's high frequency response or flatten any high frequency "peaking" that may be seen to result from phase shifts between the driver and output stage devices. Depending on the amount and location of power supply filtering provided, it may also be advisable to add power supply decoupling circuits to provide additional noise filtering for the driver stage drain supplies or the amplifier output. Such additions are common practice in amplifier design, are well known to workers skilled in the art, do not alter the basic operation of the disclosed circuit, and may be made at the discretion of the designer without departing from the spirit and scope of the present invention.

Figure 2:
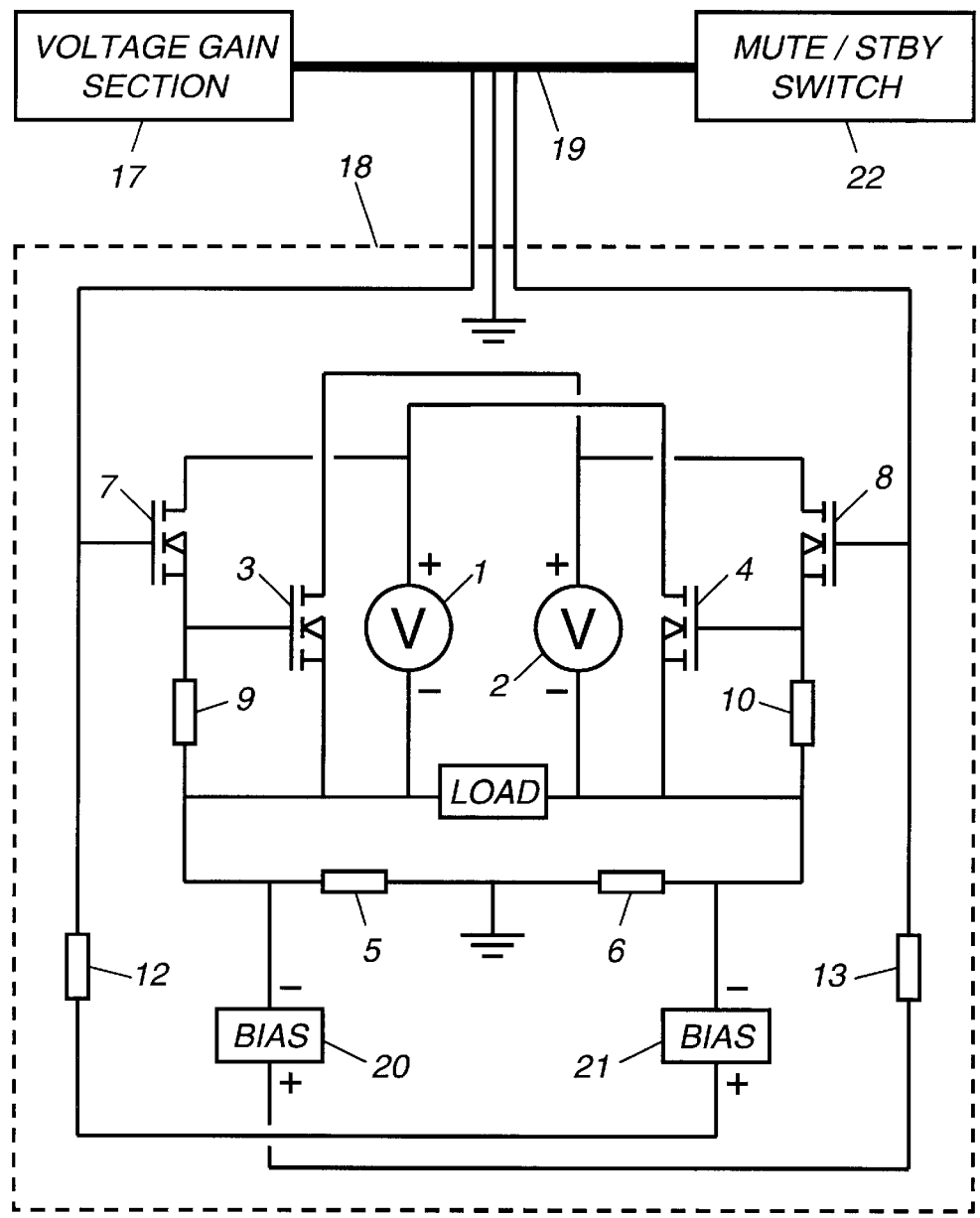
FIG. 2 is a general schematic of an alternate embodiment of the amplifier of the invention including dual cross-coupled bias sources, a separate voltage amplifier, and a remote standby/mute switch.
Figure 1:
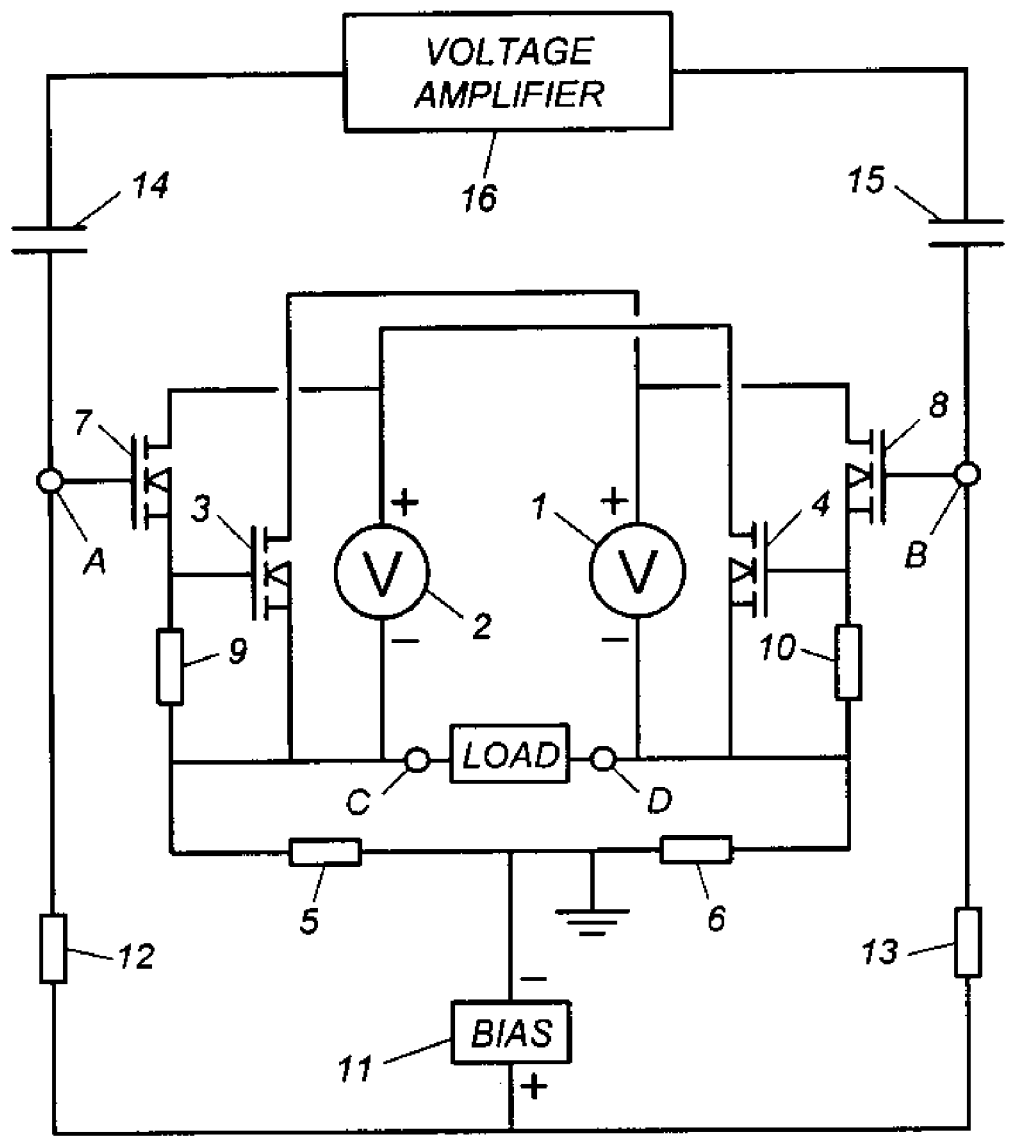
Figure 2:
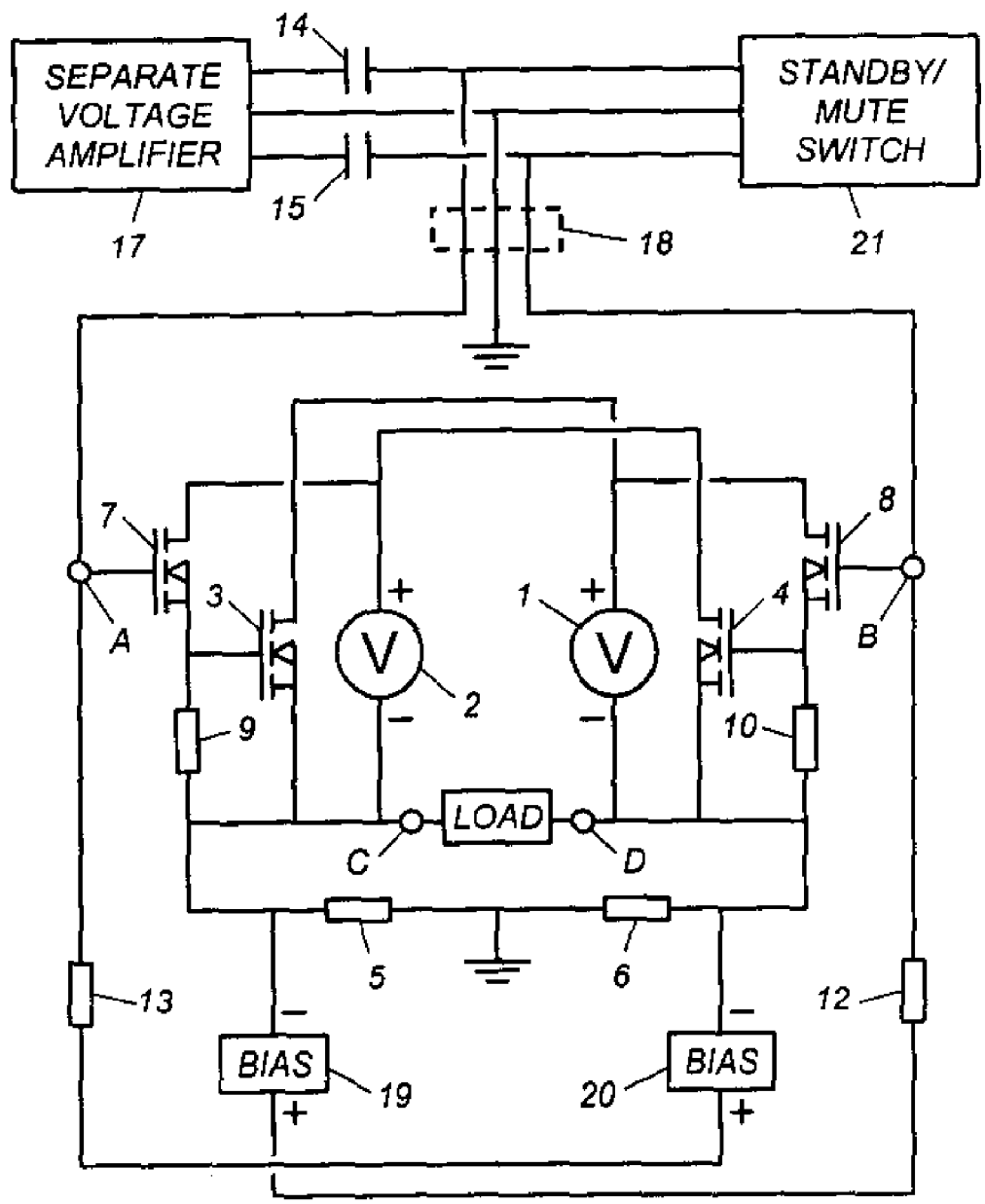

In some audio installations it is desirable, for reasons of performance or utility, to be able to separate the sensitive voltage gain section of an amplifying system from the radiated noise and temperature of a high current output section. Accordingly, FIG. 2 illustrates an alternate two-part embodiment that includes separate voltage amplifier 17. Separate voltage amplifier 17 is functionally similar to voltage amplifier 16 of FIG. 1, but has an AC-coupled output which obviates the need for capacitors 14 and 15 of the FIG. 1 embodiment. Separate voltage amplifier 17 may reside in an enclosure physically separate from that of the current amplifier, or in a sub-enclosure within or adjoining the current amplifier enclosure. In either case, the differential output of separate voltage amplifier 17 is conveyed to input terminals A and B via interconnecting cable 18. This cable typically includes at least three conductors to carry both phases of the signal from separate voltage amplifier 17 as well as a ground connection. In a two-enclosure embodiment, interconnecting cable 18 could also carry bias voltage from the voltage amplifier enclosure to the current amplifier enclosure, or DC bias voltage from the current amplifier enclosure to the voltage amplifier enclosure.

In the embodiment of FIG. 2, the single ground-referenced DC bias voltage source of FIG. 1 has been replaced by dual floating DC bias voltage sources 19 and 20, each referenced to one amplifier output terminal and cross-coupled to the opposing amplifier input terminal through a decoupling resistor. This biasing scheme achieves relative DC output stability through cross-coupling, which provides 100 percent DC negative feedback across output terminals C and D. By making floating DC bias voltage sources 19 and 20 adjustable, this scheme can also provide for adjustment of the relative output DC offset voltage, if needed. Each bias voltage can be derived from one of the floating DC power supplies in the current gain section, thereby obviating the need for a separate power supply for the bias, and further facilitating the physical separation of the amplifier's voltage and current gain sections.

FIG. 2 also shows optional standby/mute switch 21. When activated, this switch causes amplifier input terminals A and B to be connected to ground, simultaneously removing the DC bias from the current amplifier as a whole and muting the current amplifier input signal. In a two-enclosure embodiment, this switch may be installed at the voltage amplifier or some other convenient location to provide a means of remotely controlling the operation of the current amplifier. When this feature is included, series current-limiting resistors may be added ahead of amplifier input terminals A and B if needed to protect the voltage amplifier from a short circuit at its output.

The improved amplifier circuit topology described in these embodiments provides several advantages and benefits:

a) Reduced driver distortion through control of driver current and voltage fluctuations. In a typical application, each driver gain device sees a maximum variation in inter-electrode voltages (drain-to-source, gate-to-drain, and gate-to-source) of about plus and minus 2 percent and a maximum variation about its idle current of about plus and minus 20 percent. This is significantly better than the 100 percent maximum variations in voltage or current, or both, seen in comparably-simple prior art driver circuits, and driver stage distortion is correspondingly reduced.

b) Increased efficiency through almost rail-to-rail output voltage swing. Because the driver and output stage drain voltages move in opposing directions, each driver is able to swing its associated output device's gate well above its drain, an effect similar to operating the driver from a separate higher-voltage power supply. This prevents voltage clipping in the driver stage and allows the output to swing to within 1–2 volts of the power supply rails, the only losses involved being the voltage drops across the MOSFET drain-to-source ON state resistance and the output stage source resistors, if any are provided.

c) Reduced distortion and enhanced utility through high and linear input impedance. As a result of greatly suppressed driver stage voltage and current fluctuations, the input impedance of the driver stage remains relatively high and constant, and thus can be driven effectively by a separate low-power voltage amplifier. This permits a broad selection of high quality low-power or small-signal devices for use in the voltage amplifier; facilitates the physical separation of the voltage and current amplifiers for improved isolation where appropriate to the application; and reduces or eliminates dependency on global negative feedback for high performance.

As has been shown above, the present invention improves upon the prior art by providing a driver stage for a solid-state floating bridge amplifier which substantially preserves the simplicity of the floating bridge topology while operating with high efficiency and open-loop linearity. The invention facilitates other useful embodiments, including a dual-enclosure system in which the current amplifier can be remotely installed and operated.

While the above description contains many particularities, these should not be construed as limitations on the scope of the invention, but rather as examples of preferred embodiments. Many variations other than those described are possible. For example:

As an alternative to the use of signal coupling capacitors 14 and 15, direct coupling or transformer coupling could be used with suitable modifications to the bias scheme shown in the disclosed embodiments.

As an alternative to the use of MOSFETs of N channel conductivity type, P channel MOSFETs or NPN or PNP bipolar junction transistors, or some combination of these, could be used in the driver or output stages.

As an alternative to the use of single driver gain devices, a compound arrangement of two devices, such as a Darlington or Sziklai (complementary feedback) pair, could be used to further reduce current fluctuations in the controlling device of the pair, if the designer judges that the increase in cost and complexity is justified by the performance improvement achieved.

As an alternative to the use of source resistors 9 and 10, chokes or active current sources could be used to further reduce current fluctuations in the driver gain devices, if the designer judges that the increase in cost and complexity is justified by the performance improvement achieved.

As an alternative to the open-loop configurations shown in the disclosed embodiments, a moderate amount of global or interstage negative feedback could be applied, using well established methods appropriate to balanced amplifiers, to reduce overall amplifier distortion. Such feedback could be useful in applications requiring that the output stage operate at minimal idle current, and thus exhibit higher than ideal open-loop distortion, to conserve power or reduce waste heat.

Accordingly, the scope of this invention should be determined not by the embodiments described, but by the appended claims and their legal equivalents.

What is claimed is:

1. An audio amplifier, including:
   a) a solid-state floating bridge output stage including first and second output gain device means (3,4) each having an input terminal, a supply terminal, and an output terminal, a first DC power source means (1) connected between said supply terminal of said first output gain device means and said output terminal of said second output gain device means, and a second DC power source means (2) connected between said supply terminal of said second output gain device means and said output terminal of said first output gain device means;
   b) first and second amplifier output terminal means (C,D) for connecting a load across said output terminals of said first and second output gain device means respectively;
   c) a solid-state driver stage for said solid state floating bridge output stage including first and second driver gain device means (7,8) each having an input terminal, a supply terminal, and an output terminal, said first driver gain device means having its supply terminal connected to the supply terminal of said second output gain device means and its output terminal connected to said input terminal of said first output gain device means, and through a first series impedance means (9), to said first amplifier output terminal means; said second driver gain device means having its supply terminal connected to the supply terminal of said first output gain device means and its output terminal connected to said input terminal of said second output gain device means, and through a second series impedance means (10), to said second amplifier output terminal means;
   d) first and second amplifer input terminal means (A,B) for receiving a differential analog signal and presenting it to the input terminals of said first and second driver gain device means respectively; and
   e) bias means (19,20) for establishing the quiescent operating currents of said output and driver stages.

2. The amplifier of claim 1 wherein said output and driver gain device means are enhancement-mode power MOSFETs of N-channel conductivity type wherein each input terminal is a gate, each supply terminal is a drain, and each output terminal is a source.

3. The amplifier of claim 1 wherein any of said output and driver gain device means includes multiple transistors of the same conductivity type.

4. The amplifier of claim 1 wherein any of said output and driver gain device means includes a compound connection of two or more transistors of the same or complementary conductivity types.

5. The amplifier of claim 1 wherein said first and second output gain device means are matched.

6. The amplifier of claim 1 wherein said first and second driver gain device means are matched.

7. The amplifier of claim 1 wherein said driver stage is biased to operate class A up to at least 100 percent of said amplifier's maximum output power.

8. The amplifier of claim 1 wherein said output stage is biased to operate class A up to at least 10 percent of said amplifier's maximum output power.

9. The amplifier of claim 1 wherein said first and second series impedance means include resistors.

10. The amplifier of claim 1 wherein said bias means includes first and second DC voltage source means (19,20), said first DC voltage source means connected between said first amplifier output terminal means and said second amplifier input terminal means through a first series impedance means (12), and said second DC voltage source means connected between said second amplifier output terminal means and said first amplifier input terminal means through a second series impedance means (13), thereby providing essentially 100 percent negative feedback for relative DC offset voltage appearing across said first and second amplifier output terminal means for the purpose of limiting fluctuations in said relative DC offset voltage.

11. The amplifier of claim 1 further including first and second impedance means (5,6) for connecting first and second amplifier output terminal means to ground.

12. The amplifier of claim 11 wherein said first and second impedance means include resistors.

13. The amplifier of claim 11 further including first and second signal coupling means (14,15) for coupling a differential analog input signal to said first and second amplifier input terminal means respectively.

14. The amplifier of claim 13 wherein said first and second signal coupling means include capacitors.

15. The amplifier of claim 13 wherein said first and second signal coupling means include interconnecting cable means (18).

16. The amplifier of claim 13 further including switch means (21) for causing said first and second amplifier input terminal means to be connected to ground for the purpose of temporarily placing said driver and output stages in an unbiased and muted state.

17. The amplifier of claim 13 further including a voltage amplifier means (16) for the purpose of supplying a differential analog signal voltage to said first and second signal coupling means.

18. The amplifier of claim 17 wherein said voltage amplifier means is separately enclosed (17) in order to reduce exposure to radiated heat and noise, or for the purpose of allowing more convenient operational placement.

19. A method of incorporating a driver stage in a floating bridge amplifier output stage that minimizes distortion in the driver stage, maximizes amplifier output voltage swing, and provides a high and linear driver stage input impedance, comprising:

a) providing a solid-state floating bridge output stage including first and second output gain device means (3,4) each having an input terminal, a supply terminal, and an output terminal, a first DC power source means (1) connected between said supply terminal of said first output gain device means and said output terminal of said second output gain device means, and a second DC power source means (2) connected between said supply terminal of said second output gain device means and said output terminal of said first output gain device means;

b) providing first and second amplifier output terminal means (C,D) for connecting a load across said output terminals of said first and second output gain device means respectively;

c) providing a solid-state driver stage for said solid state floating bridge output stage including first and second driver gain device means (7,8) each having an input terminal, a supply terminal, and an output terminal, said first driver gain device means having its supply terminal connected to the supply terminal of said second output gain device means and its output terminal connected to said input terminal of said first output gain device means, and through a first series impedance means (9), to said first amplifier output terminal means; said second driver gain device means having its supply terminal connected to the supply terminal of said first output gain device means and its output terminal connected to said input terminal of said second output gain device means, and through a second series impedance means (10), to said second amplifier output terminal means;

d) providing first and second amplifier input terminal means (A,B) for coupling a differential analog signal to said input terminals of said first and second driver gain device means respectively; and e) providing bias means (19,20) for establishing the quiescent operating currents of said output and driver stages.

* * * * *

UNITED STATES PATENT AND TRADEMARK OFFICE
CERTIFICATE OF CORRECTION

PATENT NO.    : 6,747,513 B1
DATED         : June 8, 2004
INVENTOR(S)   : Joseph Norman Berry It is certified that error appears in the above-identified patent and that said Letters Patent is hereby corrected as shown below:

Drawings,
Delete Sheets 1 and 2, consisting of Figs. 1 and 2, and replace with the attached Sheets 1 and 2 consisting of Figs. 1 and 2.

Column 5,
Lines 8, "power supplies 2 and 1" should read -- power supplies 1 and 2 --;
Lines 10 and 15, "power supply 2" should read -- power supply 1 --;
Line 11 and 14, "power supply 1" should read -- power supply 2 --.

Column 6,
Line 5, cancel the text beginnning with "has an AC-coupled output" to and ending "Separate amplifier 17" in line 7;
Line 12, "via interconnecting cable 18" should read -- via coupling capacitors 14 and 15 and interconnecting cable 18 --.

Signed and Sealed this

Nineteenth Day of October, 2004

JON W. DUDAS
*Director of the United States Patent and Trademark Office*